(12) United States Patent
Withanawasam (10) Patent No.: US 7,271,587 B2
(45) Date of Patent: Sep. 18, 2007

(54) HIGH RESOLUTION AND LOW POWER MAGNETOMETER USING MAGNETORESISTIVE SENSORS

(75) Inventor: Lakshman S. Withanawasam, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 223 days.

(21) Appl. No.: 11/013,782

(22) Filed: Dec. 16, 2004

(65) Prior Publication Data

US 2006/0132125 A1    Jun. 22, 2006

(51) Int. Cl.
*G01R 33/02* (2006.01)
(52) U.S. Cl. .................. 324/252; 324/228; 338/32 R
(58) Field of Classification Search ............. 324/244, 324/252, 228; 338/32 R
See application file for complete search history.

(56) References Cited

U.S. PATENT DOCUMENTS

| | | | |
|---|---|---|---|
| 4,847,584 A | 7/1989 | Pant | 338/32 |
| 5,247,278 A | 9/1993 | Pant et al. | 338/32 |
| 5,952,825 A | 9/1999 | Wan | 324/252 |
| 6,717,403 B2 | 4/2004 | Witcraft | 324/252 |

OTHER PUBLICATIONS

Honeywell, "1—and 2-Axis Magnetic Sensors," Apr. 2000, pp. 1-15.

*Primary Examiner*—Reena Aurora
(74) *Attorney, Agent, or Firm*—McDonnell Boehnen Hulbert & Berghoff LLP (57) ABSTRACT

A magnetometer is disclosed that enables high resolution magnetometry using magnetoresistive sensors that consume less power. The magnetometer exploits the ability of the sensor to alter or modulate sensitivity via external means. This modulation effectively transfers the signal of interest from the noisy DC domain to the AC domain by applying an AC signal to a current strap in a magnetic field sensor. The AC signal causes a first magnetic field to be formed in a direction perpendicular to the current strap. A magnetic field sensing structure in the magnetic field sensor senses the first magnetic field. The magnetic field sensing structure uses the first magnetic field to sense a second magnetic field. The second magnetic field is an external magnetic field that is of interest. An output of the magnetic field sensing structure is an AC signal that is proportional to the second magnetic field. The AC signal may be further amplified and refined employing signal conditioning techniques.

31 Claims, 6 Drawing Sheets

HIGH RESOLUTION AND LOW POWER MAGNETOMETER USING MAGNETORESISTIVE SENSORS

FIELD

The present invention relates generally to magnetic field sensors, and more specifically, relates to magnetoresistive ("MR") sensors.

BACKGROUND

Magnetic field sensors may be used in many applications, such as magnetic compassing, ferrous metal detection, and current sensing. Magnetic field sensors may detect a magnetic field and its variations in many instances, including machine components, the earth's magnetic field, underground minerals, and electrical devices.

One type of a magnetic field sensor is an MR sensor. The MR sensor is typically composed of magnetoresistive material and formed using integrated circuit fabrication techniques. The magnetoresistive material may be permalloy, which is a ferromagnetic alloy containing nickel and iron.

The magnetoresistive material may be arranged in thin strips that are several times longer than they are wide. Each magnetoresistive strip may have a long axis, which may be referred to as an "easy" axis, and a short axis. A magnetoresistive strip may be magnetized in a particular direction, such as the direction of the easy axis, during the fabrication of the magnetoresistive strip. If the magnetoresistive strip senses an external magnetic field, the magnetization direction of the magnetoresistive strip may rotate away from the initial magnetization direction.

When a current is applied to the magnetoresistive strip, the resistance of the magnetoresistive strip may depend on angle between the direction of current flow and the direction of magnetization. A magnetization direction parallel to the current flow direction may result in maximum resistance through the magnetoresistive strip and a magnetization direction perpendicular to the current flow direction may result in minimum resistance through the magnetoresistive strip.

If the magnetoresistive strip senses a magnetic field that alters the magnetization direction of the magnetoresistive strip, the resistance of the magnetoresistive strip changes, which causes the voltage drop across the magnetoresistive strip to change as well. This change in the voltage drop across the magnetoresistive strip may be measured. The voltage change may indicate a change in the strength and/or direction of the magnetic field sensed by the magnetoresistive strip.

The magnetoresistive strip consists of many magnetic domains. The highest sensitivity is attained by aligning all the domains in a preferred direction. However, the alignment of the domains, and hence the sensitivity of the MR sensor, may be upset after manufacture due to thermal decay and by the presence of powerful magnetic fields near the magnetoresistive material of the MR sensor. Therefore, the sensitivity of an MR sensor may need to be set to the initial sensitivity prior to measurement.

One option for setting the sensitivity of an MR sensor may be to use large external magnets. However, large external magnets may not be practical when the MR sensor has already been packaged into a system or when several sensors within a single package must be magnetized in opposite directions.

Another option for setting the sensitivity of an MR sensor may be to wrap individual coils around each MR sensor. However, individual coils may be expensive and may be unable to generate the large magnetic fields required to set the sensitivity of MR sensors.

Yet another option for setting the sensitivity of an MR sensor may be to use a current strap, which may be referred to as a Set-Reset strap. A DC current pulse is typically applied to the Set-Reset strap to set the sensitivity of the MR sensor. The design and operation of a Set-Reset strap is discussed in U.S. Pat. No. 5,247,278 to Bharat B. Pant and assigned to the same assignee as the current application. U.S. Pat. No. 5,247,278 is hereby fully incorporated by reference.

Set-Reset straps may provide a more efficient means of setting the sensitivity of an MR sensor than external means, such as external magnets or individual coils, which may be larger and more expensive. Moreover, because the Set-Reset strap may be formed on the same substrate as the MR sensor, the Set-Reset strap may be located closer to the magnetoresistive strips than other options for setting the sensitivity of the MR sensor. This may allow for less energy to be used in setting the MR sensor.

Additionally, the Set-Reset strap may also be used to eliminate offset created in the MR sensor. The offset may be the result of imperfections in the magnetoresistive strips of the MR sensor. To eliminate the offset, a first DC current pulse may be applied to the Set-Reset strap in one direction. The first DC current pulse may be referred to as a SET current pulse. Then a second DC current pulse with a magnitude substantially the same as the magnitude of the SET current pulse may then be applied to the current strap in a direction substantially opposite to the direction of the SET current pulse. The second DC current pulse may be referred to as a RESET current pulse. Voltage measurements taken after both the SET current pulse and the RESET current pulse may be used to eliminate the effects of offset from the MR sensor output signal.

MR sensors are used in many consumer and industrial applications. Generally, MR sensors are small in size, reliable, manufacturable, and cost effective. However, the resolution of these MR sensors is limited by sensor noise and a large bridge offset voltage as compared with the useful signal. The sensor's noise is dominated by the Johnson noise of the resistive sensing elements and is characterized as 1/f noise, where f is the frequency. Since the useful signal of the sensor is in the DC domain, any DC signal conditioning applied to the sensor output will contain the noise components as well. Additionally, the amount of amplification that can be applied is limited by the bridge offset voltage. These factors limit the sensor's resolution.

Furthermore, the sensitivity or the efficiency of the sensor to translate the magnetic field into a voltage is proportional to the voltage applied to the sensor. Any attempt to operate the sensor at a low voltage to conserve energy will compromise the resolution due to a low signal-to-noise ratio. Accordingly, there is a need for a magnetometer that has a higher resolution, that consumes less power, and that is still small enough for use in consumer and industrial applications.

SUMMARY

A sensor having a sensing element is described. The sensing element has an associated sensitivity to a signal of interest. An external force may be used during operation of the sensor to modify, adjust, or modulate the sensitivity of the sensor. The modulation of sensitivity enables the transfer of the signal of interest from a direct current domain to an alternating current domain. Signal processing techniques in the AC domain can be applied to improve the noise level of the sensor thus leading to higher resolution sensing.

For example, the sensor may be a magnetic field sensor. The magnetic field sensor may include a magnetic field sensing structure driven by a DC source, a current strap driven by an AC source, and signal processing components. The magnetic field sensing structure may be comprised of a magnetoresistive material. A periodic SET current pulse and/or RESET current pulse is applied to the current strap to set the sensitivity of the magnetic field sensor as needed.

An AC signal may be applied to the current strap. The AC signal applied to the current strap may cause a first magnetic field to be formed in a direction perpendicular to the current strap. The first magnetic field may be a time varying periodic magnetic field.

The magnetic field sensing structure may sense the first magnetic field. The magnetic field sensing structure uses the first magnetic field as a means to measure a second magnetic field. The second magnetic field is an external magnetic field that is the magnetic field of interest. If the magnetic field sensing structure senses the second magnetic field, the magnetic field sensing structure provides an output signal that is an AC signal having an amplitude that is proportional to the second magnetic field.

The output of the magnetic field sensing structure may be connected to signal processing components. The output of the magnetic field sensing structure is an AC signal having substantially the same frequency as the AC source driving the current strap. Because the output signal of magnetic field sensing structure is not a DC signal, a coupling capacitor may be used to block the DC component of the output signal. The output of the coupling capacitor may then be fed to an amplifier. The absence of the DC component at the input of the amplifier, allows the amplifier to provide higher amplification with an improved signal-to-noise ratio. Additionally, the voltage of the DC source driving the magnetic field sensing structure may be reduced to obtain the same signal-to-noise ratio, leading to a lower power operation.

In one example, the signal processing components may also include a converter. The converter converts the AC signal to a DC signal. The magnitude of the DC signal is proportional to the magnetic field of interest (i.e., the external magnetic field being measured). The converter provides a low cost solution for providing a DC output of the magnetic field sensor.

In another example, the signal processing components may also include a lock-in amplifier. The lock-in amplifier receives both the output of the amplifier and the AC signal supplied to the current strap, which is used as a reference signal. The lock-in amplifier decouples the signal of interest from noise, leading to an improved signal-to-noise ratio, thus resulting in higher resolution.

The DC output of either the converter or the lock-in amplifier may be measured. The DC measurement may indicate the strength and/or direction of an external magnetic field detected by the magnetic field sensor.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
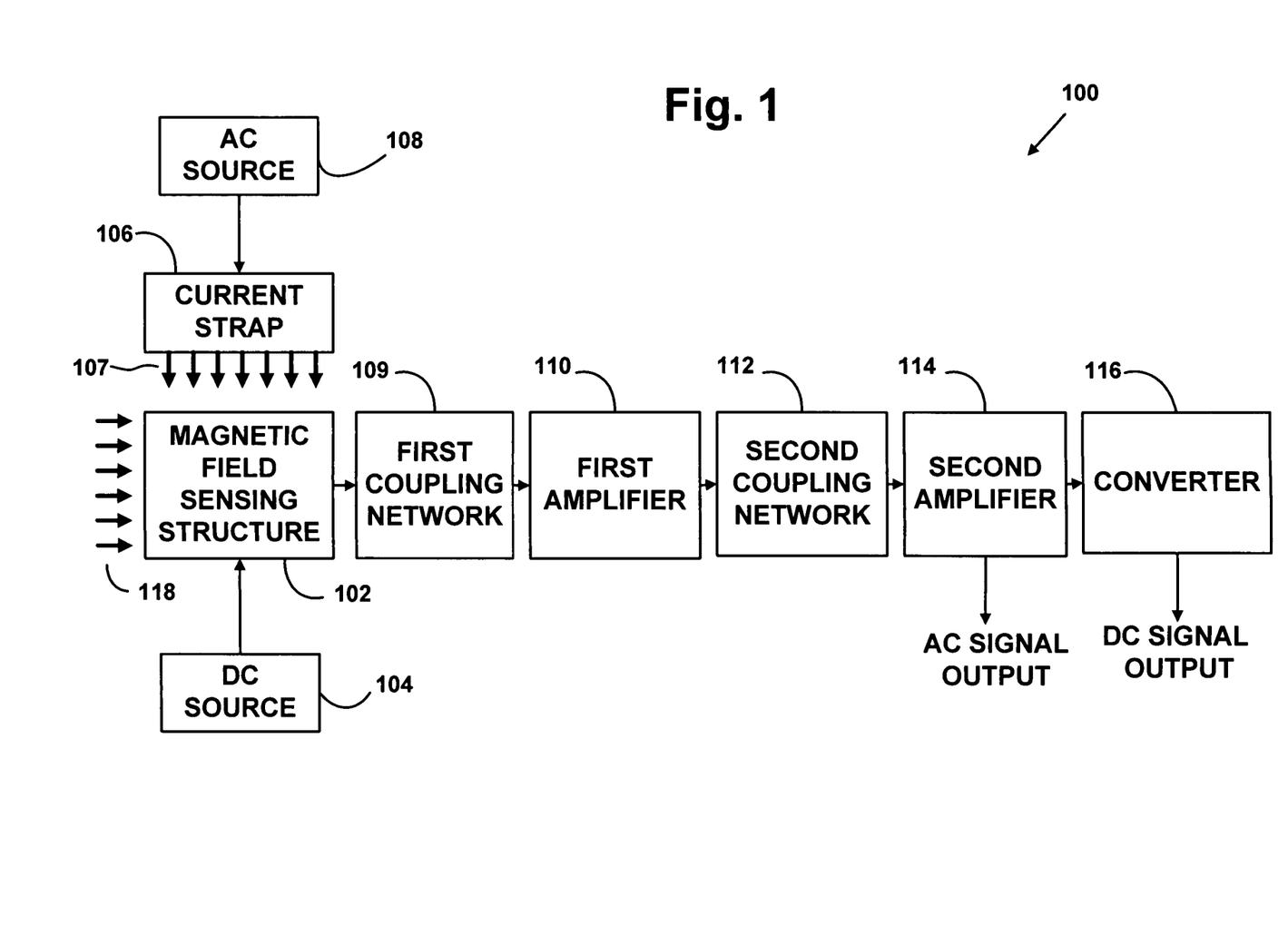
FIG. 1 is a block diagram of a magnetic field sensor, according to an example.

FIG. 1 is a block diagram of a magnetic field sensor 100. The magnetic field sensor 100 is typically formed on a semiconductor substrate using integrated circuit techniques. However, other substrate materials and fabrication techniques may be used. The magnetic sensor 100 may include a magnetic field sensing structure 102, a direct current ("DC") source 104, a current strap 106, an alternating current ("AC") source 108, a first coupling network 109, a first amplifier 110, a second coupling network 112, a second amplifier 114, and a converter 116.

Alternative components of the magnetic field sensor 100 may also be used instead of what is illustrated in FIG. 1. Also, the magnetic field sensor 100 may not require all components in all configurations. For example, only one coupling network and one amplifier may be used in some configurations of the magnetic field sensor 100.

The magnetic field sensing structure 102 may operate to detect external magnetic fields. The magnetic field sensing structure 102 may be comprised of any materials and configurations known in the art for magnetic field sensing. For example, the magnetic field sensing structure 102 may be a magnetoresistive ("MR") sensor. The magnetoresistance can be anisotropic ("AMR") or Giant ("GMR"). One example of an MR sensor includes a Wheatstone bridge, which is described in more detail with respect to FIG. 2.

Figure 2:
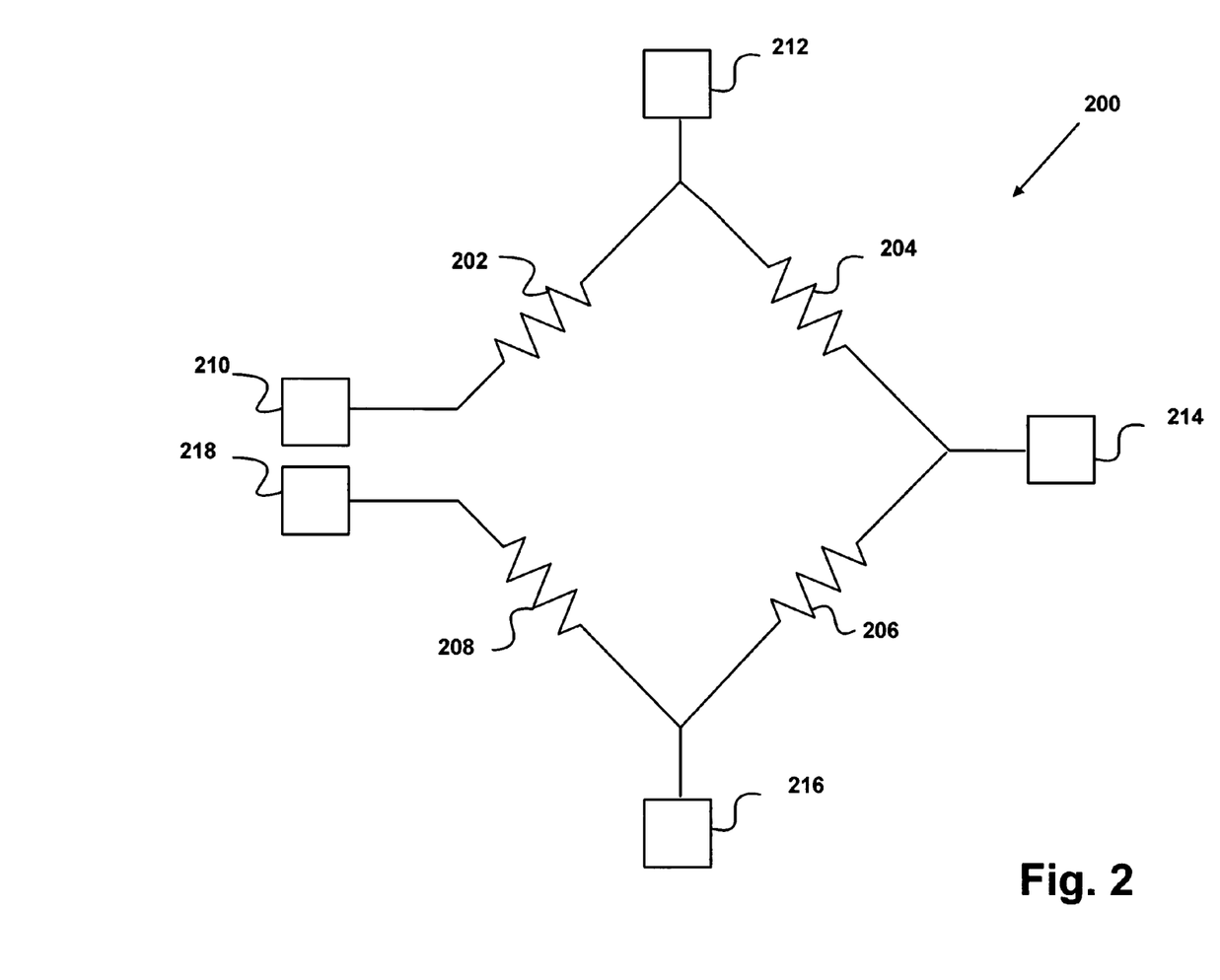
FIG. 2 is a schematic diagram of a Wheatstone bridge, according to an example.

FIG. 2 is a schematic diagram of a Wheatstone bridge 200. The Wheatstone bridge 200 may include magnetoresistive strips 202, 204, 206, and 208. The Wheatstone bridge 200 may also include terminals 210, 212, 214, 216, and 218. The Wheatstone bridge 200 may be a magnetic field sensing structure that is sensitive to external magnetic fields in a direction perpendicular to the magnetoresistive strips 202, 204, 206, and 208.

To measure an external magnetic field with the Wheatstone bridge 200, terminal 210 may be connected to terminal 218. A DC signal may then be applied to the Wheatstone bridge 200 between terminals 212 and 216. An output of the Wheatstone bridge 200 may then be measured between terminals 210 and 214.

Referring back to FIG. 1, the DC signal may be generated by the DC source 104 and applied to the magnetic field sensing structure 102. The DC signal may be a DC voltage drive or a DC current drive. For example, the DC signal may be a DC voltage substantially between 0 and 10 volts. The amount of voltage applied to the magnetic field sensing structure 102 may be less than previously required as described herein.

The current strap 106 (also known as a Set-Reset strap) is used to modulate the sensitivity of the magnetic field sensing structure 102, and consequently the output of the magnetic field sensor 100. The current strap 106 may be a serpentine or spiral current strap composed of a conductive material, such as aluminum. The current strap 106 may be located substantially above the magnetic field sensing structure 102 as depicted in FIG. 3.

Figure 3:
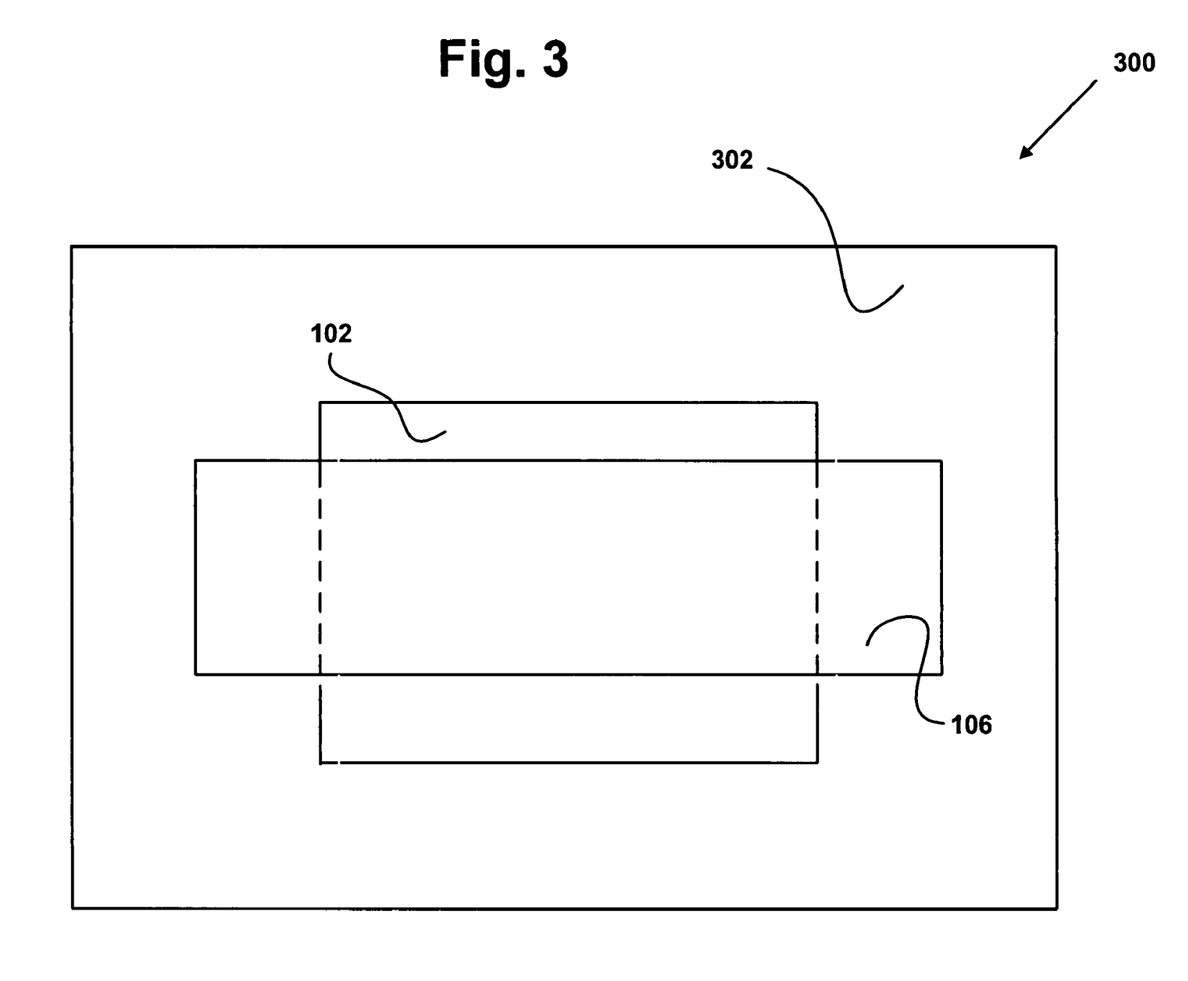
FIG. 3 is a top view of a current strap located above a magnetic field sensing structure, according to an example.

FIG. 3 is a top view of a magnetic field sensor 300 depicting the current strap 106 located above a magnetic field sensing structure 102. The current strap 106 may be formed on the same substrate 302 as the magnetic field sensing structure 102. The substrate 302 provides the base for the magnetic field sensor 300 and may comprise a silicon wafer, a glass layer, or other appropriate material.

Referring back to FIG. 1, the magnetoresistive material of the magnetic field sensing structure 102 may be set in a preferred magnetization direction during manufacture. The preferred magnetization direction may be in the direction of the easy axis, which is typically along the length of the magnetoresistive material. However, exposure to a magnetic field after manufacture may upset the magnetization direction of the magnetoresistive material if the magnetic field is strong enough. If the magnetization direction of the magnetoresistive material is upset, measurements taken with the magnetic field sensing structure 102 may not be accurate and/or repeatable.

The sensitivity of the magnetic field sensing structure 102 may be set and/or reset by applying a DC current pulse to the current strap 106. If the DC current pulse is large enough, a magnetic field formed in a direction perpendicular to the current strap 106 may be strong enough at the magnetic field sensing structure 102 to rotate the magnetization direction of the magnetoresistive material back to the initial magnetization direction. For example, the DC current pulse applied to the current strap 106 of the magnetic field sensing structure 102 may have a magnitude of approximately 4 amps and last approximately 2 microseconds After a SET pulse, the sensitivity of the magnetic field sensing structure 102 is restored. Typically, after the SET pulse, a positive magnetic field results in a positive output. A RESET pulse also restores the sensitivity of the magnetic field sensing structure 102. However, the RESET pulse restores the sensitivity in a direction opposite to that of the SET pulse. Typically, after the RESET pulse, a positive magnetic field results in a negative output.

The current strap 106 may be used in the magnetic field sensor 100 to cause the magnetic field sensing structure 102 to provide an AC output. Causing the magnetic field sensing structure 102 to provide the AC output may enable the magnetic field sensor 100 to make measurements that are more accurate and reliable than magnetic field sensing structures that provide a DC output. Additionally, the voltage from the DC source 104 may be reduced while maintaining the same signal-to-noise ratio.

An AC signal may be applied to the current strap 106. The AC signal applied to the current strap 106 may be generated by the AC source 108. The AC signal may be a time varying periodic signal, such as a sine wave, a cosine wave, a square wave, or a triangle wave. For example, the AC signal may be a sinusoid with a frequency of 1 KHz.

Applying the AC signal to the current strap 106 may cause a first magnetic field 107 to be formed in a direction perpendicular to the current strap 106 and substantially along the length of the magnetic strips. The first magnetic field 107 may be a time varying periodic magnetic field that is internal to the magnetic field sensor 100 (i.e., the first magnetic field 107 is not the external magnetic field that is the field of interest).

The magnetoresistive material of the magnetic field sensing structure 102 may sense the first magnetic field 107. If the magnetoresistive material of the magnetic field sensing structure 102 senses the first magnetic field 107, the magnetization direction of the magnetoresistive material may begin to oscillate. The oscillation of the magnetoresistive material may cause the output signal of the magnetic field sensing structure 102 (i.e., the output signal representative of the external magnetic field of interest, referred to herein as the second magnetic field 118) to be a time varying periodic signal.

The magnetic field sensing structure 102 may also sense the second magnetic field 118. The second magnetic field 118 may be an external magnetic field generated outside of the magnetic field sensor 100, which is the magnetic field of interest. The magnetic field sensing structure 102 generally senses the second magnetic field 118 in a transverse direction to the magnetic strips. The magnetic field sensing structure 102 uses the first magnetic field 107 to measure the second magnetic field 118. The amplitude of the output signal of the magnetic field sensing structure 102 may be an AC signal having an amplitude that is proportional to the second magnetic field 118.

The output of the magnetic field sensing structure 102 may be coupled to an input of the first amplifier 110 via the first coupling network 109. In this example, an output of the first amplifier 110 may then be coupled to an input of the second amplifier 114 via the second coupling network 112. Alternatively, the output of the magnetic field sensing structure 102 may be coupled to the input of the second amplifier 114 via the second coupling network 112, without the use of the first amplifier 110 and the first coupling network 109.

The first coupling network 109 may operate to transfer energy from one component of a circuit to another component of the circuit. The first coupling network 109 may be comprised of any materials and configurations known in the art for coupling. The first coupling network 109 may be capable of transferring both DC components and AC components of an input of the first coupling network 109 to an output of the first coupling network 109. For example, the first coupling network 109 may be a direct coupling network, such as a resistor. Alternatively, the first coupling network 109 may be capable of transferring just the AC components of an input of the first coupling network 109 to an output of the first coupling network 109. For example, the first coupling network 109 may be a capacitor.

The first amplifier 110 may operate to amplify electronic signals. The first amplifier 110 may be comprised of any materials and configurations known in the art for signal amplification. The first amplifier 110 may be a voltage amplifier capable of amplifying low level AC signals, such as AC signals having an amplitude in the μVolts to mVolts range. For example, the first amplifier 110 may be an operational amplifier.

The second coupling network 112 may operate to transfer energy from one component of a circuit to another component of the circuit. The second coupling network 112 may be comprised of any materials and configurations known in the art for coupling. The second coupling network 112 may be capable of substantially attenuating DC components of an input of the second coupling network 112 and transferring AC components of the input of the second coupling network 112 to an output of the second coupling network 112. For example, the second coupling network 112 may be a coupling capacitor. The capacitance of the coupling capacitor may be chosen to optimally transfer the AC signal, taking into consideration the frequency of the output signal from the AC source 108 and the input and output impedances of the components to be coupled.

Using the second coupling network 112 to substantially attenuate the DC components of the input of the second coupling network 112 may eliminate the offset created in the magnetic field sensing structure 102, as well as any DC bias superimposed on the signal by amplifiers 110 and 114. Accordingly, the process previously described for eliminating the offset using the current strap 106 may no longer be necessary. Additionally, substantially attenuating the offset created in the magnetic field sensing structure 102 may allow a much higher amplification to be applied to the output signal of the first coupling network 109 and/or the second coupling network 112.

The second amplifier 114 may operate to amplify electronic signals. The second amplifier 114 may be comprised of any materials and configurations known in the art for signal amplification. The second amplifier 114 may be a voltage amplifier capable of amplifying AC signals. For example, the second amplifier 114 may be an operational amplifier.

The output of the second amplifier 114 may then be measured. The measurement may be taken with an oscilloscope or any other device used to measure AC voltage. The measurement may indicate the strength and/or direction of the second magnetic field 118 sensed by the magnetic field sensor 100.

Alternatively, the output of the second amplifier 114 may be connected to an input of the converter 116. The converter 116 may operate to convert AC signals to DC signals. The converter 116 may be comprised of any materials and configurations known in the art for converting. For example, the converter 116 may be a rectifier.

The DC output of the converter 116 may then be measured. The measurement may be taken with a voltmeter, multimeter, oscilloscope, or any other device used to measure DC voltage. The measurement may indicate the strength and/or direction of the second magnetic field 118 sensed by the magnetic field sensor 100.

The magnetic field sensor 100 may consume less power than previous magnetic field sensors because the DC voltage applied to the magnetic field sensor 100 can be reduced while maintaining the signal-to-noise ratio. Additionally, the magnetic field sensor 100 may be implemented at a lower cost because the converter 116 may be a relatively inexpensive component.

Figure 4:
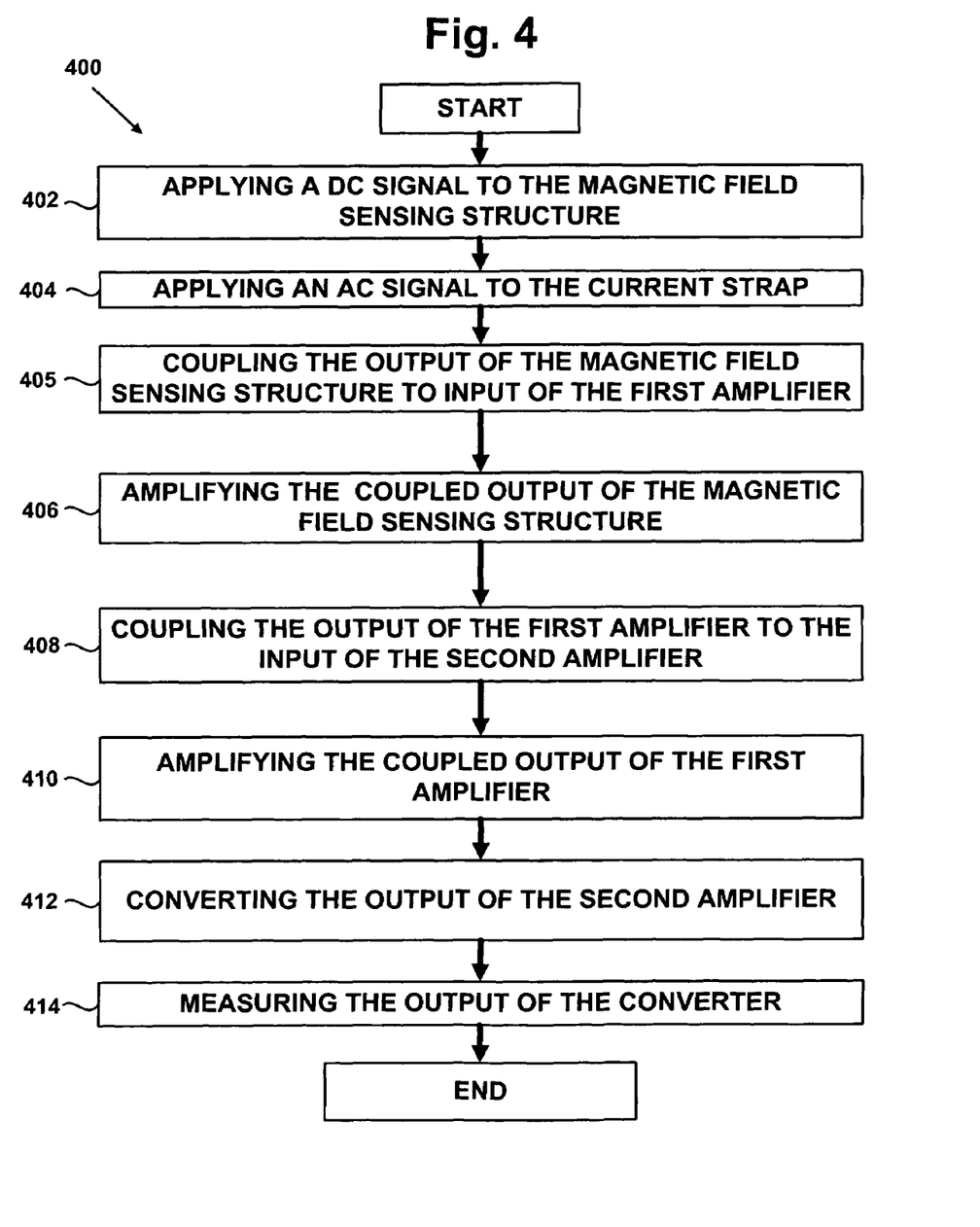
FIG. 4 is a flow diagram of a method for measuring a magnetic field using the magnetic field sensor depicted in FIG. 1, according to an example.

FIG. 4 is a flow diagram of a method 400 for measuring a magnetic field using the magnetic field sensor 100 depicted in FIG. 1. At block 402, the DC signal may be applied to the magnetic field sensing structure 102. The DC signal may be generated by the DC source 104, which may provide a DC voltage or a DC current. One example of the magnetic field sensing structure 102 is the Wheatstone bridge 200. The Wheatstone bridge 200 may be driven by a DC voltage substantially between 0 and 10 volts.

At block 404, the AC signal may be applied to the current strap 106. The AC signal may be generated by the AC source 108. The AC signal may be a time varying periodic signal, such as a sine wave, a cosine wave, a square wave, or a triangle wave. For example, the AC signal may be a sinusoid with a frequency of 1 kilo Hertz.

The AC signal applied to the current strap 106 may cause the first magnetic field 107 to be formed in a direction perpendicular to the current strap 106. The first magnetic field 107 may be a time varying periodic magnetic field.

The magnetoresistive material of the magnetic field sensing structure 102 may sense the first magnetic field 107. If the magnetoresistive material of the magnetic field sensing structure 102 senses the first magnetic field 107, the magnetization direction of the magnetoresistive material may begin to oscillate. The oscillation of the magnetoresistive material may cause the output signal of the magnetic field sensing structure 102 to be a time varying periodic signal. If the magnetic field sensing structure 102 also senses the second magnetic field 118 (i.e., the external magnetic field of interest), the amplitude of the output signal of the magnetic field sensing structure 102 may be proportional to the second magnetic field 118.

At block 405, the output of the magnetic field sensing structure 102 may be coupled to the input of the first amplifier 110 with the first coupling network 109. The first coupling network 109 may be capable of transferring both the DC components and the AC components of the input of the first coupling network 109 to the output of the first coupling network 109. For example, the first coupling network 109 may be a resistor. Alternatively, the first coupling network 109 may be capable of transferring just the AC components of the input of the first coupling network 109 to the output of the first coupling network 109. For example, the first coupling network 109 may be a capacitor.

At block 406, the coupled output of the magnetic field sensing structure may be amplified with the first amplifier 110. The first amplifier 110 may be a voltage amplifier capable of amplifying low level AC signals. For example, the first amplifier 110 may be an operational amplifier.

At block 408, the output of the first amplifier 110 may be coupled to the input of the second amplifier 114 with the second coupling network 112. The second coupling network 112 may be capable of substantially attenuating the DC components of the input of the second coupling network 112 and transferring the AC components of the input of the second coupling network 112 to the output of the second coupling network 112. For example, the second coupling network 112 may be a coupling capacitor.

At block 410, the coupled output of the first amplifier 110 may be amplified with the second amplifier 114. The second amplifier 114 may be a voltage amplifier capable of amplifying AC signals. For example, the second amplifier 114 may be an operational amplifier.

At block 412, the output of the second amplifier 114 may be converted from an AC signal to a DC signal with the converter 116. For example, the converter 116 may be a rectifier.

At block 414, the DC output of the converter 116 may be measured. The measurement may be taken with a voltmeter, multimeter, oscilloscope, or any other device used to measure DC voltage. The measurement may indicate the strength of the second magnetic field 118 sensed by the magnetic field sensor 100.

Figure 5:
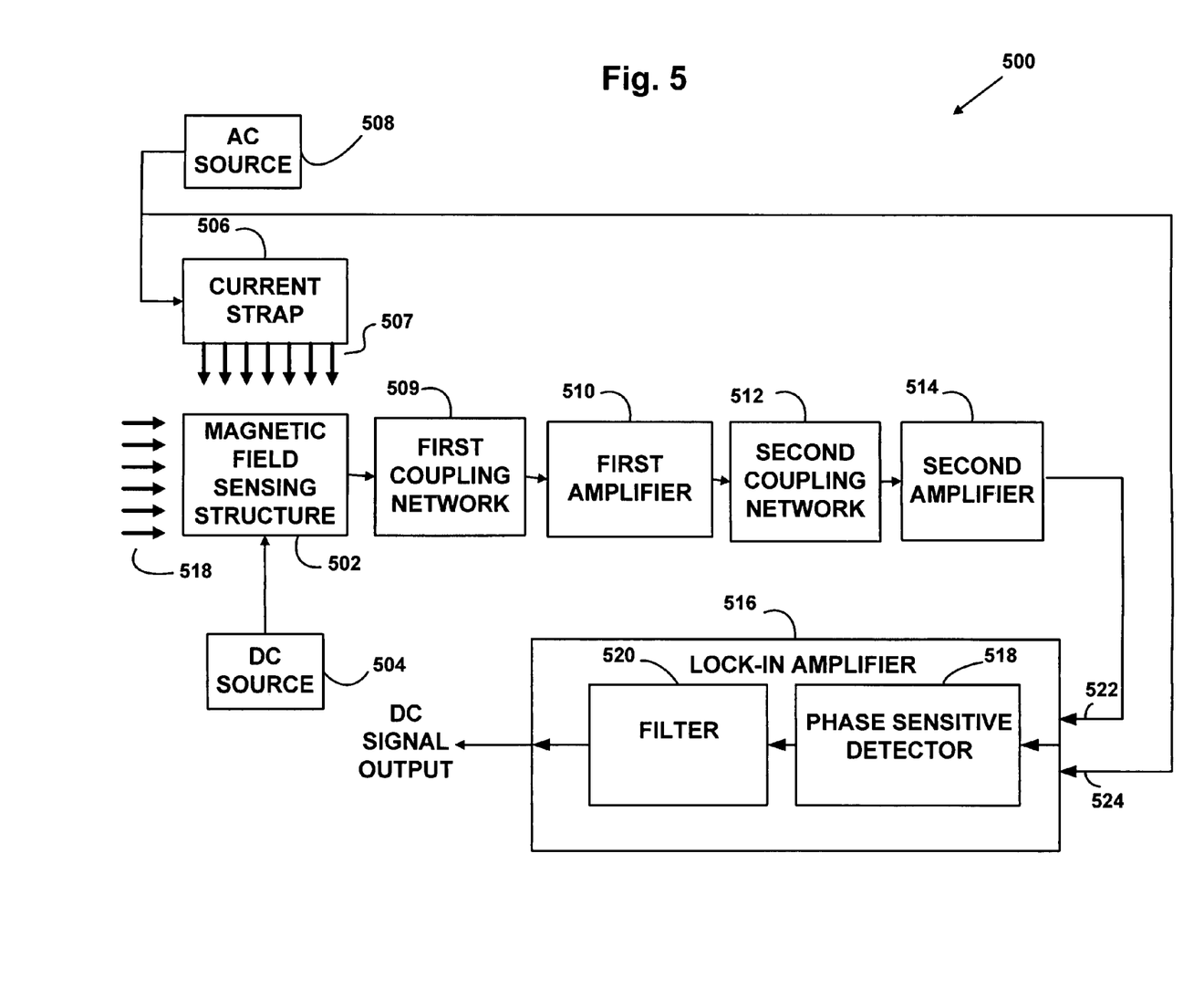
FIG. 5 is a block diagram of a magnetic field sensor, according to another example.

FIG. 5 is a block diagram of a magnetic field sensor 500, according to another example. The magnetic field sensor 500 may be similar to the magnetic field sensor 100. However, the magnetic field sensor 500 may include a lock-in amplifier 516 instead of the converter 116 illustrated in FIG. 1.

In this example, the lock-in amplifier 516 may include a phase sensitive detector 518 and an output filter 520. The lock-in amplifier 516 may also include additional signal processing components not illustrated in FIG. 5. The lock-in amplifier 516 may operate to measure an AC signal at a first input of the lock-in amplifier 516 and convert the measurement to a proportional DC signal at an output of the lock-in amplifier 516. The lock-in amplifier 516 may be comprised of any materials and configurations known in the art for lock-in amplification.

The output of the second amplifier 514 may be connected to the first input of the lock-in amplifier 516 and may be referred to as a signal channel 522. The signal channel 522 may be conditioned in the lock-in amplifier 516 with signal processing components, such as an amplifier or a band-pass filter. The signal channel 522 may then be connected to a first input of the phase sensitive detector 518 within the lock-in amplifier 516.

The output of the AC source 508 may be connected to a second input of the lock-in amplifier 516 and may be referred to as a reference channel 524. The reference channel 524 may have substantially the same frequency and phase as the signal channel 522. The reference channel 524 may also be conditioned in the lock-in amplifier 516 with signal processing components, such as a phase shifter. The reference channel 524 may then be connected to a second input of the phase sensitive detector 518 within the lock-in amplifier 516.

The phase sensitive detector 518 may operate to multiply the signal channel 522 with the reference channel 524 to produce a demodulated output. The phase sensitive detector 518 may be, for example, an analog multiplier, digital switch, or digital multiplier.

An output of the phase sensitive detector 518 may be connected to an input of the output filter 520 within the lock-in amplifier 516. The output filter 520 may operate to substantially attenuate AC components of the output of the phase sensitive detector 518 and transfer DC components of the output of the phase sensitive detector 518 to an output of the lock-in amplifier 516. The output filter 520 is typically an RC filter. However, other filter designs may also be used.

The DC output of the lock-in amplifier 516 may then be measured. The measurement may be taken with a voltmeter, multimeter, oscilloscope, or any other device used to measure DC voltage. The measurement may indicate the strength and/or direction of the second magnetic field 518 sensed by the magnetic field sensor 500.

The magnetic field sensor 500 may consume less power than previous magnetic field sensors because the magnetic field sensor 500 may operate at a lower voltage level. Additionally, the magnetic field sensor 500 may measure magnetic fields at a higher resolution because the lock-in amplifier 516 measures the input signal in the AC domain having a narrow bandwidth centered about the frequency of the set/reset strap excitation current. The lock-in amplifier selected dictates how narrow this bandwidth is. The resolution of the magnetic field sensor 500 depends on the frequency of the output of the AC source 508.

Figure 6:
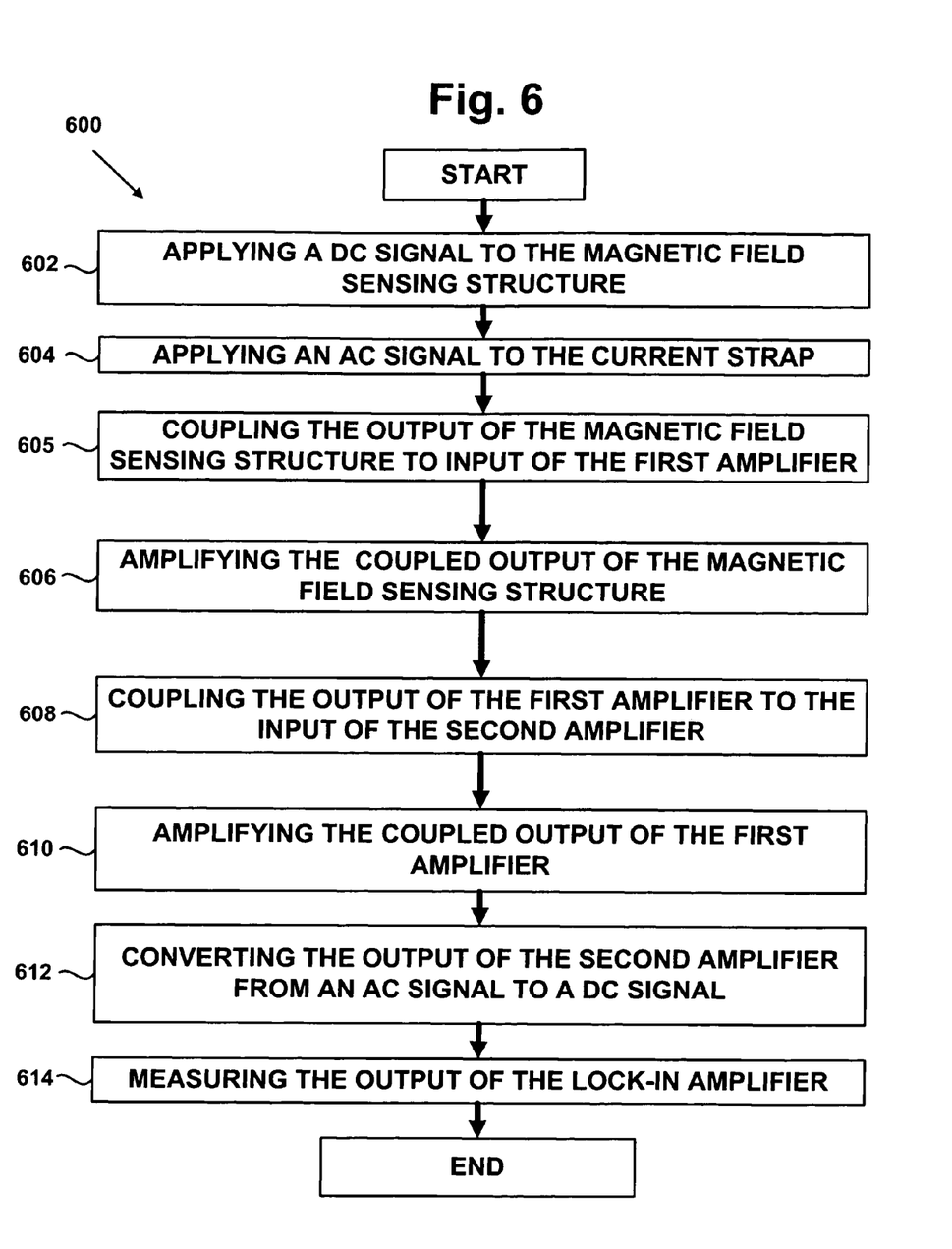
FIG. 6 is a flow diagram of a method for measuring a magnetic field using the magnetic field sensor depicted in FIG. 5, according to an example.

FIG. 6 is a flow diagram of a method 600 for measuring a magnetic field using the magnetic field sensor 500 depicted in FIG. 5. The method 600 may be similar to the method 400. However, at block 612, an AC signal at the output of the second amplifier 514 may be measured and converted to a DC signal at the output of the lock-in amplifier 516.

The output of the second amplifier 514 may be connected to the first input of the lock-in amplifier 516 and may be referred to as a signal channel 522. The signal channel 522 may be conditioned in the lock-in amplifier 516 with signal processing components, such as an amplifier or a band-pass filter. The signal channel 522 may then be connected to a first input of the phase sensitive detector 518 within the lock-in amplifier 516.

The output of the AC source 508 may be connected to a second input of the lock-in amplifier 516 and may be referred to as a reference channel 524. The reference channel 524 may have substantially the same frequency and phase as the signal channel 522. The reference channel 524 may also be conditioned in the lock-in amplifier 516 with signal processing components, such as a phase shifter. The reference channel 524 may then be connected to a second input of the phase sensitive detector 518 within the lock-in amplifier 516.

The phase sensitive detector 518 may operate to multiply the signal channel 522 with the reference channel 524 to produce a demodulated output. The phase sensitive detector 518 may be, for example, an analog multiplier, digital switch, or digital multiplier.

An output of the phase sensitive detector 518 may be connected to an input of the output filter 520 within the lock-in amplifier 516. The output filter 520 may operate to substantially attenuate AC components of the output of the phase sensitive detector 518 and transfer DC components of the output of the phase sensitive detector 518 to an output of the lock-in amplifier 516. The output filter 520 is typically an RC filter. However, other filter designs may also be used.

At block 614, the DC output of the lock-in amplifier 516 may be measured. The measurement may be taken with a voltmeter, multimeter, oscilloscope, or any other device used to measure DC voltage. The measurement may indicate the strength of the second magnetic field 518 sensed by the magnetic field sensor 500.

It should be understood that the illustrated embodiments are examples only and should not be taken as limiting the scope of the present invention. For example, a magnetic field sensor was provided as an example of a sensor having a sensing element whose sensitivity can be modified by an external force. However, this applies to other sensors as well. It is also understood that various other signal processing components may be used. The claims should not be read as limited to the described order or elements unless stated to that effect. Therefore, all embodiments that come within the scope and spirit of the following claims and equivalents thereto are claimed as the invention.

I claim:

1. A magnetic field sensor, comprising in combination:
   a current strap for setting a sensitivity of the magnetic field sensor;
   an alternating current source applying an alternating current signal to the current strap, wherein the alternating current signal causes a first magnetic field to be formed in a direction perpendicular to the current strap; and
   a magnetic field sensing structure operable to use the first magnetic field to sense a second magnetic field, and wherein an output signal of the magnetic field sensing structure is an AC signal having an amplitude that is proportional to the second magnetic field.

2. The magnetic field sensor in claim 1, wherein the magnetic field sensing structure is a magnetoresistive sensor.

3. The magnetic field sensor in claim 1, wherein a DC source is applied to the magnetic field sensing structure.

4. The magnetic field sensor in claim 1, wherein the magnetic field sensor further comprises a first amplifier.

5. The magnetic field sensor in claim 4, wherein an output of the magnetic field sensing structure is coupled to an input of the first amplifier via a first coupling network.

6. The magnetic field sensor in claim 5, wherein the first coupling network is a resistor.

7. The magnetic field sensor in claim 5, wherein the first coupling network is a capacitor.

8. The magnetic field sensor in claim 5, wherein the magnetic field sensor further comprises a second amplifier.

9. The magnetic field sensor of claim 8, wherein an output of the second amplifier provides an AC signal output that is proportional to the second magnetic field.

10. The magnetic field sensor in claim 8, wherein an output of the first amplifier is coupled to an input of the second amplifier via a second coupling network.

11. The magnetic field sensor in claim 10, wherein the second coupling network is operable to substantially attenuate a DC component of an output signal of the first amplifier.

12. The magnetic field sensor in claim 10, wherein the second coupling network is a capacitor.

13. The magnetic field sensor in claim 10, wherein the magnetic field sensor further comprises a converter.

14. The magnetic field sensor in claim 13, wherein an output of the second amplifier is connected to an input of the converter.

15. The magnetic field sensor of claim 13, wherein an output of the converter provides a DC signal output that is proportional to the second magnetic field.

16. The magnetic field sensor in claim 10, wherein the magnetic field sensor further comprises a lock-in amplifier.

17. The magnetic field sensor in claim 16, wherein the output of the second amplifier is connected to an input of the lock-in amplifier.

18. The magnetic field sensor of claim 16, wherein an output of the lock-in amplifier provides a DC signal output that is proportional to the second magnetic field.

19. A magnetic field sensor, comprising in combination:
a current strap for setting a sensitivity of the magnetic field sensor;
an alternating current source applying an alternating current signal to the current strap, wherein the alternating current signal causes a first magnetic field to be formed in a direction perpendicular to the current strap;
a magnetoresistive sensor that is operable to use the first magnetic field to sense a second magnetic field, and wherein an output signal of the magnetoresistive sensor is an AC signal having an amplitude that is proportional to the second magnetic field;
a first amplifier, wherein the output of the magnetoresistive sensor is coupled to the input of the first amplifier via a resistor;
a second amplifier, wherein the output of the first amplifier is coupled to the input of the second amplifier via a capacitor; and
a converter, wherein the output of the second amplifier is connected to the input of the converter, and wherein the converter provides as an output a DC signal that is proportional to the second magnetic field.

20. A magnetic field sensor, comprising in combination:
a current strap for setting a sensitivity of the magnetic field sensor;
an alternating current signal applying an alternating current signal to the current strap, wherein the alternating current signal causes a first magnetic field to be formed in a direction perpendicular to the current strap;
a magnetoresistive sensor that is operable to use the first magnetic field to sense a second magnetic field, and wherein an output signal of the magnetoresistive sensor is an AC signal having an amplitude that is proportional to the second magnetic field;
a first amplifier, wherein the output of the magnetoresistive sensor is coupled to the input of the first amplifier via a resistor;
a second amplifier, wherein the output of the first amplifier is coupled to the input of the second amplifier via a capacitor; and
a lock-in amplifier, wherein the output of the second amplifier is connected to the input of the lock-in amplifier, and wherein the lock-in amplifier provides as an output a DC signal that is proportional to the second magnetic field.

21. A method for measuring a magnetic field with a magnetic field sensor, comprising applying an AC signal to a current strap of the magnetic field sensor, wherein the AC signal causes a first magnetic field to be formed in a direction perpendicular to the current strap, wherein a magnetic field sensing structure is operable to use the first magnetic field to sense a second magnetic field, and wherein an output signal of the magnetic field sensing structure is an AC signal having an amplitude that is proportional to the second magnetic field.

22. The method of claim 21, further comprising coupling an output of the magnetic field sensing structure to an input of a first amplifier.

23. The method of claim 22, wherein the coupling includes using a resistor to transfer both DC components and AC components of the output of the magnetic field sensing structure to the input of the first amplifier.

24. The method of claim 22, wherein the coupling includes using a capacitor to transfer AC components of the output of the magnetic field sensing structure to the input of the first amplifier.

25. The method of claim 22, further comprising amplifying the coupled output of the magnetic field sensing structure with the first amplifier.

26. The method of claim 25, further comprising coupling an output of the first amplifier to an input of a second amplifier.

27. The method of claim 26, wherein The coupling includes using a capacitor to substantially attenuate DC components of the output of the first amplifier and transfer AC components of the output of the first amplifier to the input of the second amplifier.

28. The method of claim 26, further comprising amplifying the coupled output of the first amplifier.

29. The method of claim 28, further comprising converting an AC output of the second amplifier.

30. The method of claim 29, wherein the converting includes using a lock-in amplifier to convert the AC output of the second amplifier to a DC signal at an output of the lock-in amplifier.

31. The method of claim 30, further comprising measuring the output of the lock-in amplifier.

* * * * *